United States Patent
Baars et al.

(10) Patent No.: US 11,864,298 B2
(45) Date of Patent: Jan. 2, 2024

(54) DEVICE FOR TREATING A PRODUCT WITH MICROWAVES

(71) Applicant: MUEGGE GMBH, Reichelsheim (DE)

(72) Inventors: Daniel Baars, Fränkisch-Crumbach (DE); Markus Reichmann, Michelstadt-Rehbach (DE); Klaus-Martin Baumgärtner, Brensbach (DE); Niko Voit, Lützelbach (DE)

(73) Assignee: MUEGGE GMBH, Reichelsheim (DE)

( * ) Notice: Subject to any disclaimer, the term of this patent is extended or adjusted under 35 U.S.C. 154(b) by 868 days.

(21) Appl. No.: 16/648,938

(22) PCT Filed: Sep. 17, 2018

(86) PCT No.: PCT/EP2018/075065
§ 371 (c)(1),
(2) Date: Mar. 19, 2020

(87) PCT Pub. No.: WO2019/057662
PCT Pub. Date: Mar. 28, 2019

(65) Prior Publication Data
US 2020/0253008 A1 Aug. 6, 2020

(30) Foreign Application Priority Data
Sep. 19, 2017 (DE) ............. 10 2017 121 731.2

(51) Int. Cl.
*H05B 6/70* (2006.01)
*H05B 6/72* (2006.01)
(Continued)

(52) U.S. Cl.
CPC ............ *H05B 6/78* (2013.01); *A23L 3/001* (2013.01); *A23L 3/01* (2013.01); *H05B 6/702* (2013.01); *H05B 6/72* (2013.01); *H05B 6/782* (2013.01)

(58) Field of Classification Search
CPC ...... A23L 3/001; A23L 3/01; H01J 37/32192; H01J 37/3222; H01J 37/32229;
(Continued)

(56) References Cited

U.S. PATENT DOCUMENTS 4,951,602 A * 8/1990 Kanai ............... H01L 21/67207
136/258
6,863,773 B1 * 3/2005 Emmerich .......... H01J 37/3222
118/723 MW
(Continued)

FOREIGN PATENT DOCUMENTS

WO 0075955 A1 12/2000

OTHER PUBLICATIONS

International Search Report (dated Nov. 15, 2018) for corresponding International App. PCT/EP2018/075065.

*Primary Examiner* — Quang T Van
(74) *Attorney, Agent, or Firm* — WRB-IP PLLC

(57) ABSTRACT

A device for treating a product with microwaves includes a treatment chamber, in which the product can be transported along a transport path in a transport direction through the treatment chamber, and a microwave radiation device arranged in the treatment chamber, by means of which microwaves coupled into the microwave radiation device can be radiated, which act on the product, wherein the microwave radiation device includes at least one coaxial conductor which protrudes into the treatment chamber, or is arranged therein, with an electrically-conductive internal conductor and an electrically-conductive external conductor, wherein the external conductor, arranged coaxially, sur-
(Continued)

rounds the internal conductor in a spaced manner and includes at least one opening, which enables an emission of microwaves from the coaxial conductor through the opening on to the product.

5 Claims, 3 Drawing Sheets

(51) Int. Cl.
*H05B 6/78* (2006.01)
*A23L 3/00* (2006.01)
*A23L 3/01* (2006.01)

(58) Field of Classification Search
CPC ..... H01J 37/32752; H05B 6/702; H05B 6/72; H05B 6/78; H05B 6/782; A23V 2002/00
USPC ....... 219/701, 710, 680, 687, 700, 684, 697, 219/746, 748, 121.36
See application file for complete search history.

(56) References Cited

U.S. PATENT DOCUMENTS

2003/0226643 A1   12/2003   Muegge et al.
2008/0053988 A1    3/2008   Arai et al.

\* cited by examiner

DEVICE FOR TREATING A PRODUCT WITH MICROWAVES

BACKGROUND AND SUMMARY

The invention relates to a device for treating a product with microwaves, wherein the device comprises a treatment chamber, in which the product can be transported through the treatment chamber along a transport path in a transport direction, and a microwave radiation arranged in the treatment chamber, by means of which microwaves decoupled into the microwave radiation device can be emitted, which act on the product.

It is known from practice that microwaves can be used to heat products such as food and food products to be prepared. For this purpose, microwaves that have a suitable microwave frequency are emitted into a treatment chamber, in which the product to be heated is located. The microwaves emitted into the treatment chamber and penetrating the product located there produce heat in the product, wherein the heating can be set or varied by means of the emitted microwave output, or the duration of the microwave irradiation, for example.

It is also known that microwaves can be used to heat industrial products during a production process, or a processing of the products. Microwaves can also be used to sterilize and preserve food products or convenience foods, since a sufficiently intensive microwave radiation allows a very intensive heating of products in a very short period of time.

In treatment devices known from practice, the microwave can be coupled, via a waveguide, into a treatment chamber in which the product to be treated is arranged. The treatment chamber can have suitable dimensions depending on the microwave frequency used, so that the treatment chamber forms a resonator, and the formation of standing waves inside the treatment chamber is made possible or facilitated. However, it is seen as a significant disadvantage that regularly only a non-uniform heating of a product is possible in spatially-expansive products in such treatment chambers, since the spatial distribution of the microwave energy inside the treatment chamber is very non-uniform, especially in the formation of standing waves.

It is also known from practice that the microwaves can be coupled into the treatment chamber, and emitted in the treatment chamber in a manner directed to the product by the use of horn antennae. However, a relatively non-uniform heating of a product arranged in the treatment chamber can often be observed in these treatment devices just as well.

DE 101 57 601 B4 discloses a device for treating a product with microwaves, in which a microwave radiation device arranged in the treatment chamber comprises a rod antenna, along which a coupled-in microwave radiation propagates and is emitted radially to the surroundings of the rod antenna. By means of the suitable arrangement of shields, a part of the microwave radiation, which is radiated in a direction facing away from the product, is reflected and guided back in the direction of the product, by means of the rod antenna. In this way, a comparatively high portion of the microwave radiation can be directed on to the product and be used for the treating of the product. By the use of the rod antenna, a propagation of the microwaves in the axial direction along the rod antenna is promoted, and thereby the emission of microwaves into the treatment chamber is made possible beyond an axial extension of the rod antenna, wherein this extension can be significantly greater than in horn antennae. However, it turned out that also when using a rod antenna, the coupled-in microwaves generate a non-uniform microwave radiation in axial directions alongside the rod antenna, and a product arranged adjacent to the rod antenna is heated or treated correspondingly in a non-uniform manner.

By a movement of the product on the transport path, which occurs during the treatment with the microwaves, the problem of a non-uniform heating of the product is not reduced. Rather, while the product is displaced, microwaves act on the product, which, when penetrating the product, have an ever-changing distance from the microwave radiation device and thus act on the product with an ever-changing intensity. Even in geometrically simple microwave radiation devices, and when neglecting reflection or scattering effects inside the treatment chamber, complex distributions of intensity are often times produced in the treatment chamber, which complicate a uniform treatment of the product moving along the transport path. In view of an as high as possible product throughput in an as short as possible operating period of the device, a continuously effected transport of multiple products successively through the treatment chamber would be desirable.

It is desirable to provide a device that has a transport path, for the treatment of products arranged thereon with microwaves, guided through the treatment chamber, in such a way that the products to be treated can be heated by the emitted microwaves as uniformly as possible with as little effort as possible. Here, as far as possible, an inhomogeneous product, which has regions of different composition, is to be heatable as uniformly as possible by simple means.

According to an aspect of the invention, a microwave radiation device comprises at least one coaxial conductor protruding into the treatment chamber and having an electrically-conductive internal conductor and an electrically-conductive external conductor wherein the external conductor, arranged coaxially, surrounds the internal conductor in a spaced manner and comprises at least one opening, which enables an emission of microwaves from the coaxial conductor through the opening on to the product. A microwave coupled into the coaxial conductor can propagate in the coaxial conductor over the entire length or axial extension of the coaxial conductor. Between the electrically-conductive internal conductor and the electrically-conductive external conductor, a dielectric material, an in particular a dielectric solid body, can be arranged, which has a high permittivity and generates a low dielectric power loss for the microwaves propagating in the coaxial conductor. Through the at least one opening, the microwaves initially propagating in the coaxial conductor can exit the coaxial conductor through the respective opening and be emitted by the coaxial conductor. By the arrangement and the dimension of the at least one opening, an emission of the emanated microwaves directed to the product can occur, and thereby an effective and targeted treatment and heating of the products, respectively.

It is advantageous that the coaxial conductor is adapted to the in-coupled microwaves and in particular to the frequency of the in-coupled microwaves in terms of its dimensions in such a way that a standing wave is formed in the coaxial conductor. The one opening or the multiple openings can advantageously each be arranged in a region of an electric field strength node of the standing wave, since an especially effective emission of microwaves through the respective opening can be effected there.

When the coaxial conductor comprises multiple openings, the openings are expediently spaced from one another approximately by half a wavelength of the wavelength of the microwaves coupled into the coaxial conductor, or by an integer multiple thereof, in order to allow an effective out-coupling of the microwaves coupled-into the coaxial conductor through all openings. Each individual opening has an extent, in the axial direction, of a quarter wavelength or at least less than half a wavelength of the microwaves coupled into the coaxial conductor. One opening extends over less than half a circumference in the circumferential direction of the coaxial conductor, wherein in a larger opening angle, higher microwave output can be emitted through the opening, which, however, can be focused in better ways and be directed more intensely to the product by a smaller opening angle.

Optionally, a hollow-cylindrical dielectric solid body can be arranged in an internal space between the internal conductor and the external conductor, the permittivity of which is greater than the permittivity of air. The dielectric solid body advantageously has a most small dielectric loss factor for the frequency range provided for during operation. The internal space between the internal conductor and the external conductor is essentially completely filled by the hollow-cylindrical dielectric solid body. However, both for tolerance reasons and also because of the different thermal expansion coefficients of the material of the internal conductor and of the external conductor on the one hand and of the dielectric solid body on the other hand, it is expedient that a small slot remains around the internal conductor. The dielectric solid body has a small distance, in the radial direction, at least to the internal conductor and possibly also to the external conductor, so that the dielectric solid body has a small distance to the internal conductor either across the entire circumferential surface or at least sectionally, or, as the case may be, instead or additionally to the external conductor.

In view of a most efficient emission of the microwaves through the opening, it is advantageous that the dielectric solid body has a feature protruding inwards or projecting outwards, in the region of the at least one opening. By means of a suitable course of the contour of the dielectric solid body in the region of the opening, an in particular in a transition region along a circumferential edge of the opening, an input impedance of the coaxial conductor can be adapted to an output impedance of the surrounding medium in the treatment chamber, in order to enable a most advantageous out-coupling of the microwaves from the coaxial conductor into the treatment chamber.

By the arrangement and the configuration of the at least one opening, expediently however of the two or more openings in the coaxial conductor, the microwave output emitted from the coaxial conductor in the direction of the product can be adapted to the product to be treated, in order to allow an as uniform as possible heating of the product when the product is transported along the transport path in the transport direction past the coaxial conductor.

According to an advantageous embodiment of the inventive idea, it is provided that the microwave radiation device comprises multiple coaxial conductors, arranged spaced from one another in the transport direction of the transport path, with at least one opening in the respective external conductor. The multiple coaxial conductors are advantageously arranged transversely to the transport direction and protrude from a lateral edge of the transport path as far as to the opposite lateral edge, so that the coaxial conductors oriented transversely to the transport direction can each completely cover a width of the transport path. A product transported on the transport path past the coaxial conductors is irradiated with microwaves by each coaxial conductor, so that the microwave output emitted by each of the coaxial conductors contributes to the treatment of the product with microwaves. The individual coaxial conductors can be adapted to the overall desired or predetermined microwave output, which is required for the respective product, in terms of the microwave output radiated by each coaxial conductor. For another product, which merely requires less microwave output for the treatment thereof, individual coaxial conductors can be turned-off, or not be supplied with in-coupled microwaves, for example.

According to a particularly advantageous embodiment of the inventive idea, it is provided that, in a coaxial conductor arranged downstream in the transport direction, the at least one opening is arranged transversely offset to the transport direction relative to the at least one opening of an upstream coaxial conductor. The offset arrangement of the openings disposed one after the other in the transport direction of the multiple coaxial conductors allows generating a microwave radiation composed of multiple openings across the entire width of the transport path and using it for the treatment of the product. The individual openings can, in the axial direction of the coaxial conductor or transversally to the transport direction of the transport path, have a comparatively small extent. As far as a sufficient number of coaxial conductors is arranged one after the other and the respective openings of the successive coaxial conductors are arranged offset to the openings of the preceding coaxial conductors, the entire width of the transport path and in particular the maximum width of a product transported thereon can be covered and be homogenously irradiated with microwaves by the multiple openings arranged successively and laterally offset to one another.

It is considered to be particularly advantageous that the microwave radiation device comprises a predetermined number of coaxial conductors each with at least one opening, so that the openings arranged one behind the other in the transport direction completely cover a product transported via the transport path in a transverse direction extending transversally to the transport direction across a treatment length of the transport path.

For many products, in particular food products and convenience food, microwaves with a frequency of 2.45 GHz can be used to preserve or sterilize the products. The microwaves comprise a wavelength of approximately 12 cm. In the case that other frequencies are used for the coupled-in microwaves, such as 915 MHz or 5.8 GHz, the wavelength thereof changes accordingly. The coaxial conductors, which expediently are adapted to the respective wavelength with regard to their dimensions, can extend across multiple wavelengths in the axial direction and, for example, have a total length of more than 50 cm, or more than 100 cm. In these cases, it is particularly advantageous when the coaxial conductors comprise at least two openings or more.

In view of a most homogenous irradiation of a product with microwaves, it is optionally provided that at least one axial conductor is arranged on a first side of the transport path, and at least one further coaxial conductor is arranged on a second side of the transport path opposite the first side. The coaxial conductors can, for example, be arranged and oriented transversally across the transport path both from the left and from the right. In products with a predominantly flat shape, such as in convenience food prepared on a tray-like or plate-like container, it is particularly advantageous if the coaxial conductors are arranged both above and below the transport path, and the respective openings are each oriented to the product transported along on the transport path. In high-protruding products, additional coaxial conductors can be arranged laterally on the left and right sides of the transport path and act on the product from the respective side. In this way, the products can be irradiated with microwaves from multiple sides, and thereby be heated quickly and uniformly.

According to a particularly advantageous embodiment of the inventive idea, it is provided that at least one coaxial conductor, with first dimensions, is adapted to a first microwave frequency, and at least one additional coaxial conductor, with second dimensions other than the first dimensions, is adapted to a second microwave frequency different from the first microwave frequency. Microwaves having different microwave frequencies penetrate the product to different penetration depths, and can lead to a differently strong local heating within the product. In particular in products with an in-homogenous composition, for example in convenience food with different ingredients, which are prepared on a plate-like or tray-like container, it can be highly advantageous that the irradiation of the product is possible by different microwave frequencies within the same treatment chamber. Thus, for example, a large-area low microwave radiation, which is sufficient for some regions of a product, can be effected with a first number of coaxial conductors, which are supplied with a low microwave frequency, in order to additionally irradiate individual regions of the product that require an additional heating or treatment in a targeted manner with coaxial conductors that are adapted to a second, higher microwave frequency.

BRIEF DESCRIPTION OF THE DRAWINGS

Hereinafter, different exemplary embodiments of the inventive idea are explained, which are represented in the drawing. The Figures show in.

DETAILED DESCRIPTION

Figure 1:
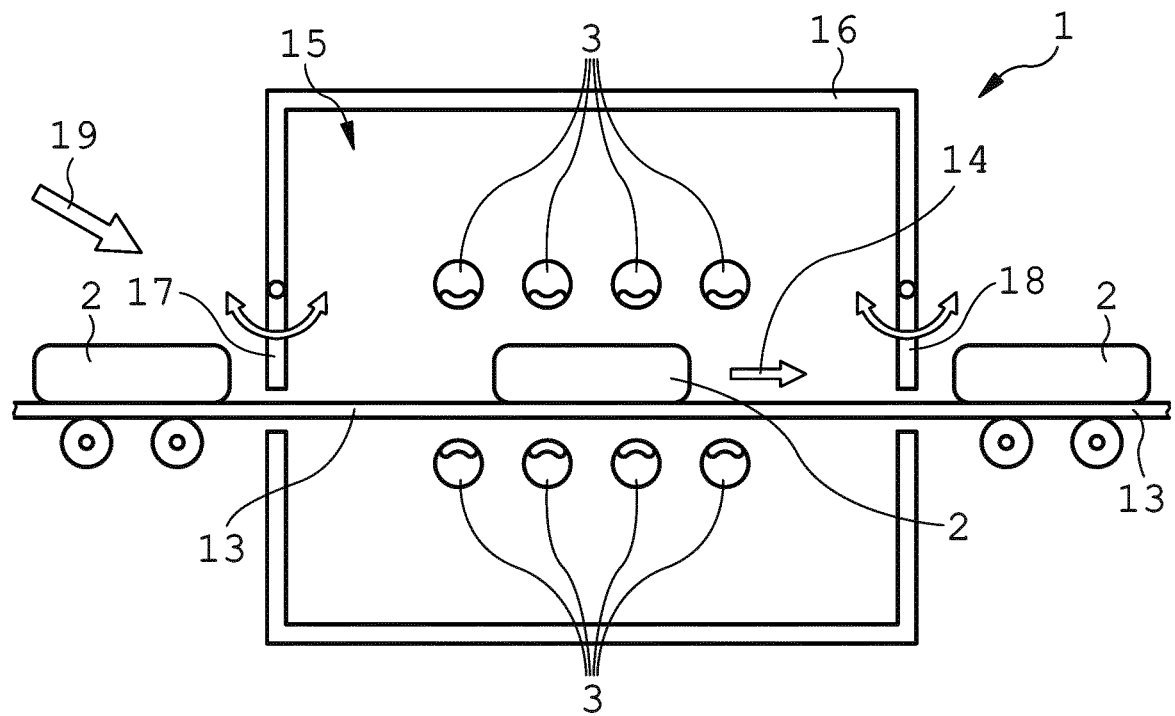
FIG. 1 a device, according to the invention, for the treatment of a product with microwaves, wherein a number of coaxial conductors protrude into a treatment chamber, in which the product is transported along a transport path in a transport direction, FIG. 2 a perspective view of an individual coaxial conductor, FIG. 3 a view of an arrangement of coaxial conductors, as can be used in the treatment chamber shown in FIG. 1, FIG. 4 a view of a differently-configured arrangement of coaxial conductors, and FIG. 5 a second view of yet a further different arrangement of coaxial conductors.

In a device 1 for treating a product 2 with microwaves, which is schematically shown in FIG. 1, a microwave radiation device comprises multiple coaxial conductors 3, which, in the represented exemplary embodiment, are arranged above and below the product 2, and can irradiate the product 2 with microwaves.

Figure 2:
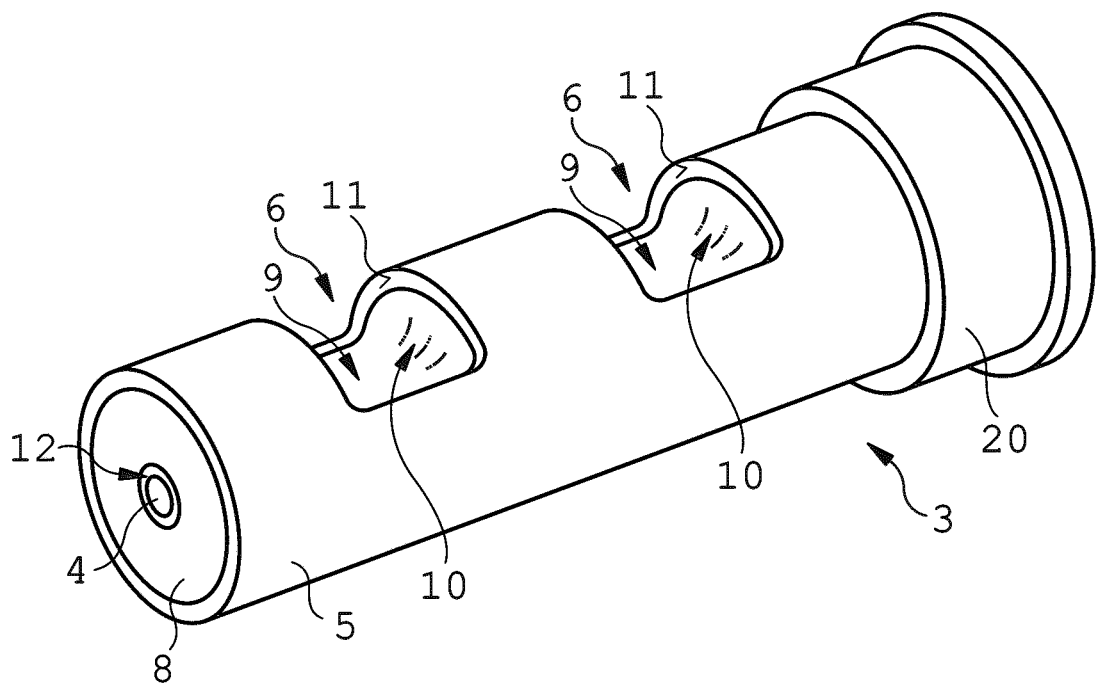

A single coaxial conductor 3, which is exemplary shown in FIG. 2, comprises an electrically-conductive internal conductor 4 and a hollow-cylindrical and electrically-conductive external conductor 5, which is coaxially arranged around the internal conductor 4. The coaxial conductor 3 can, in the axial direction, have a length of a few centimeters up to more than 50 cm or 1 m. Both the length of the coaxial conductor 3 and the radial dimensions of the internal conductor 4 and in particular of the external conductor 5 are expediently adapted to the frequency or wavelength of the microwaves, which are to be coupled into the coaxial conductor 3 during operation of the device 1.

In the exemplary embodiment shown in FIG. 2, the external conductor 4 comprises two openings 6. The external conductor 5 could, however, also have only one opening 6, or likewise more than two openings 6. The two openings 6 respectively extend in the circumferential direction across slightly less than half the circumference of the external conductor 5. In the exemplary embodiment, both openings 6 are spaced in the axial direction by approximately one wavelength of the microwaves coupled-in during operation with a predetermined microwave frequency. If, for example, an advantageous microwave frequency of 2.45 GHz is used for the heating of food products, the distance of the two openings 6 in the axial direction is approximately 12 cm.

Expediently, a distance between the two openings 6 is selected in such a way that the distance is a multiple of half the wavelength of the microwaves fed-in with the predetermined microwave frequency, wherein each of the openings 6 is arranged in the region of an electric field intensity node. The length of the coaxial conductor 3 is advantageously set in such a way that the coupled-in microwaves form a standing wave in the coaxial conductor 3.

A hollow-cylindrical dielectric solid body 8 is arranged between the internal conductor 4 and the external conductor 5. The dielectric solid body 8 comprises or consists, for example, of Polyethylene or of Polytetrafluorethylene and has a significantly higher permittivity than air, as well as a comparatively small dielectric power loss for the in-coupled microwaves. The dielectric solid body 8 also increases the mechanical strength of the coaxial conductor 3.

In a region defined by the openings 6 of the external conductor 5, the solid body 8 comprises in each case one feature 9 protruding inwards. A shape of the features 9 is designed in such a way, in particular in the transition region 10 along a circumferential edge 11 of the openings 6, that a most effective out-coupling of the microwaves from the coaxial conductor 3 through the openings 6 into the surroundings is made possible.

A small annular gap 12 is provided between the internal conductor 4 and the surrounding dielectric solid body 8, in order to be able to compensate, for one, fluctuations of the respective dimensions due to tolerance during the manufacture of the coaxial conductor 3, and on the other hand in order to be able to compensate the different expansions of the internal conductor 4 and of the dielectric solid body 8 during operation due to the different thermal expansion coefficients of the respectively used materials.

In the device 1 shown in FIG. 1, the product 2 is transported on a transport path 13 along a transport direction, indicated by an arrow 14, through a treatment chamber 15. The transport path 13 can, for example, be a circulating conveyor belt moveable in the transport direction 14, on which the product 2 is transported. The transport path 13 can also be a contact surface defined by a frame or a path-like platform, on which the product 2 is transported in the transport direction 14 using transport devices such as externally moved or automatically driven product carriers. The product can also be transported alongside the transport path 13 by means of suitable manipulators, such as robot arms, gripping devices or e.g. transport tubes applied with pressure or negative pressure. In the device shown in an exemplary manner, the transport path 13 is a conveyor belt displaceable in the transport direction 14.

The treatment chamber 15 is surrounded by a housing 16, wherein the product 2 on the transport path 13 can be transported into the treatment chamber 15 through a first, only schematically shown lock apparatus 17, and can be transported out of the treatment chamber through a second lock apparatus 18. The housing 16 surrounding the treatment chamber 15 and the lock apparatuses 17, 18 are expediently configured in such a way that during a treatment of the product 2 with microwaves, which are emitted by the coaxial conductors 3, no significant part of the microwave output emitted into the treatment chamber 15 can escape to the outside.

In the exemplary embodiment shown in FIG. 1, in each case four coaxial conductors 3 are arranged above the transport path 13 and below the transport path 13. This arrangement of the coaxial conductors 3 is indicated in FIG. 3 from a viewing direction indicated by an arrow 19 in FIG. 1.

Figure 3:
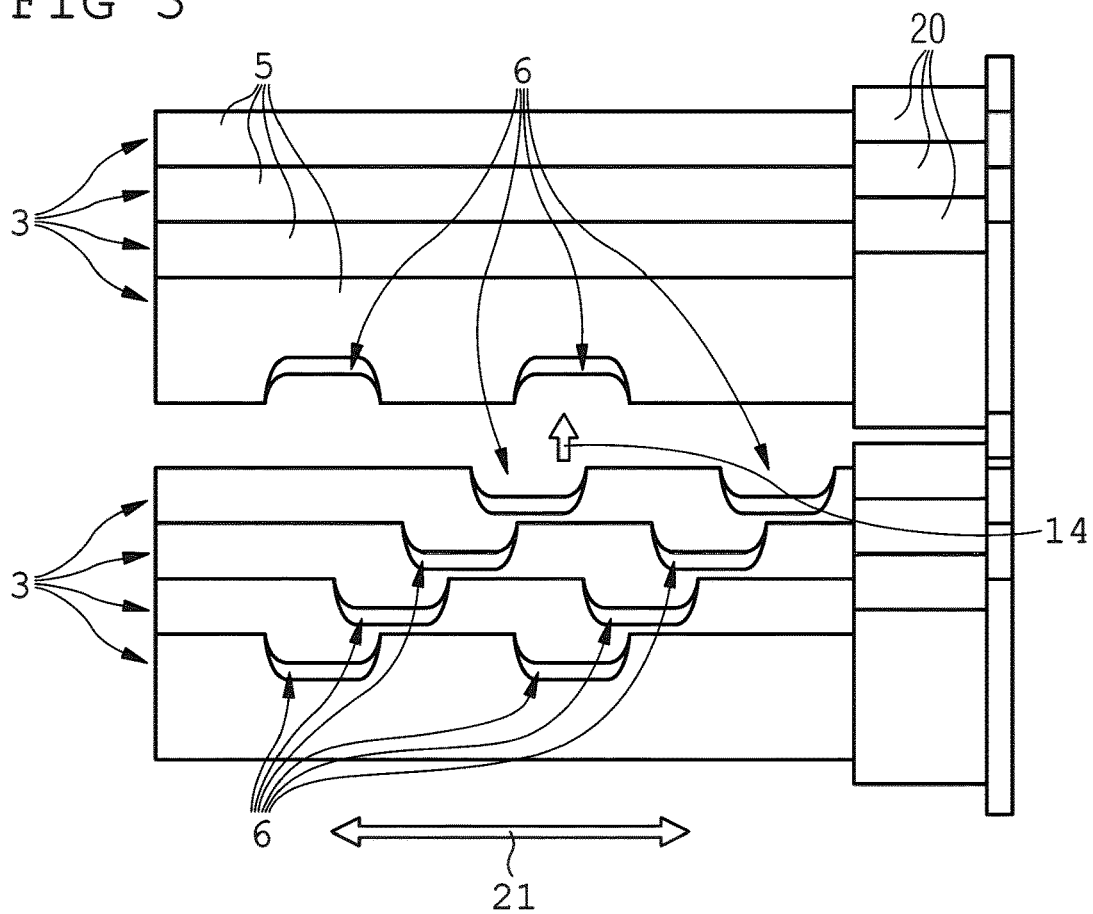

Each coaxial conductor 3 protrudes transversally to the transport direction 14 over the transport path 13 shown in FIG. 3. In the view of the coaxial conductors 3 in FIG. 3, microwaves can respectively be coupled from the right into each of the coaxial conductors 3 via a respective coupling device 20. The microwaves, which initially propagate along the coaxial conductors 3, are emitted through the openings 6 in the direction of the product 2, which is likewise not shown and is located between the two rows of the coaxial conductors 3. A maximum width of the product 2 is indicated by a longitudinal arrow 21. The coaxial conductors 3 extend, in the axial direction of the coaxial conductors 3 or transversally to the transport direction 14, in each case across and beyond the maximum width 21 of the product 2.

The two openings 6 of coaxial conductors 3 successive in the transport direction 14 are in each case arranged relatively offset to one another transversally to the transport direction 14. In this way, despite a distance of the two openings 6 of an individual coaxial conductor 3, the product 2 can however be homogenously irradiated with microwaves and, thereby, be heated or treated during its transport movement alongside the transport direction 14 in each region of the successive openings 6 despite a distance of the two openings 6 of an individual coaxial conductor 3. The openings 6, which are disposed successively in the transport direction 14, are arranged in such a way that the opening surfaces of the openings 6, in surfaces in each case face the product 2, transversally to the transport direction 14, cover the width 21 of the product 2 completely and without any gap.

Figure 4:
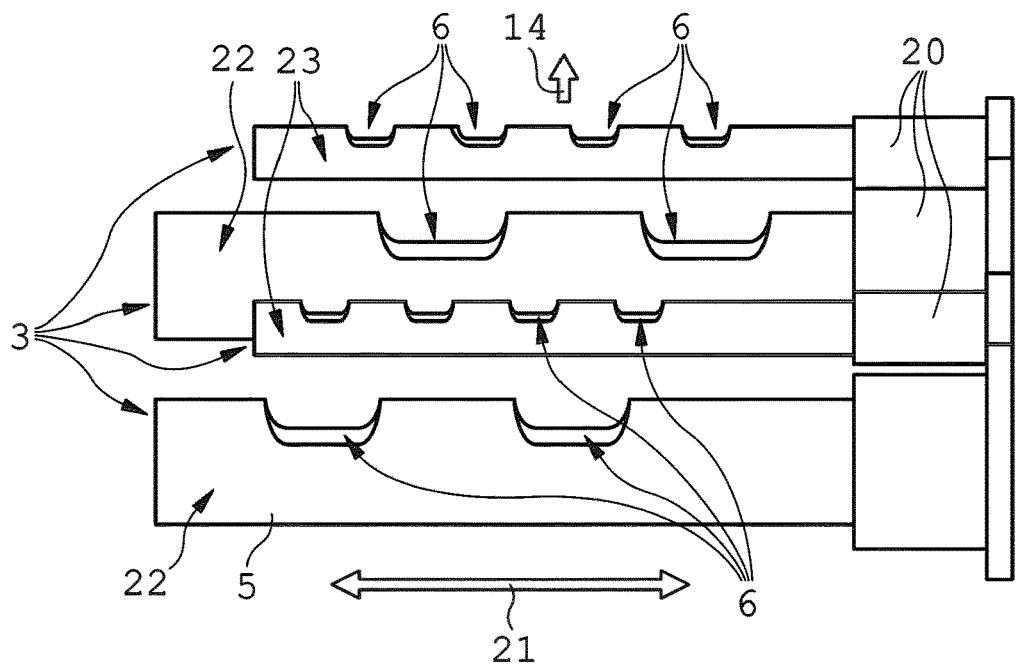

In an exemplary embodiment shown in an exemplary manner in FIG. 4, an arrangement of four coaxial conductors 3, which, in the device 1 shown in FIG. 1, can be arranged above as well as below the transport path 13, comprises two different types 22, 23 of coaxial conductors 3. The first type 22 of the coaxial conductors 3 includes two coaxial conductors 3, which with respect to their respective dimensions are adapted to an in-coupling of microwaves with a microwave frequency of 2.45 GHz, so that a standing wave with a characteristic wavelength of approx. 6 cm is formed in the coaxial conductors 3, wherein the arrangement of the two openings 6 is predetermined in electrical field strength nodes of the standing wave. The second type 23 of the coaxial conductors 3 includes two coaxial conductors 3, which in terms of the respective dimensions are adapted to an in-coupling of microwaves with a microwave frequency of 5.8 GHz, so that a standing wave respectively is formed in the coaxial conductors 3 each with a characteristic wavelength of slightly more than 5 cm, wherein the arrangement of in each case four openings 6 is predetermined in electric field strength nodes of the standing wave.

With such an arrangement of two types 22, 23 of coaxial conductors 3, the product moved past the coaxial conductors 3 can be irradiated with microwaves of two different wavelengths in a very homogenous manner. The microwaves penetrate the product 2 to a different penetration depth depending on the wavelength, and can be focused or operated with different intensity. In this way, even inhomogeneous products 2 can be treated in a very uniform manner by a suitable selection of different types 22, 23 of coaxial conductors 3 and a suitable definition of the respective number and orientation of the coaxial conductors 3, and, for example, be heated very homogenously during a short retention time inside the treatment chamber. It is also possible that more than two different types 22, 23 of coaxial conductors 3, which are each adapted to different wavelengths of the in-coupled microwave radiation, can be combined with one another respectively with a different number and arrangement.

Figure 5:
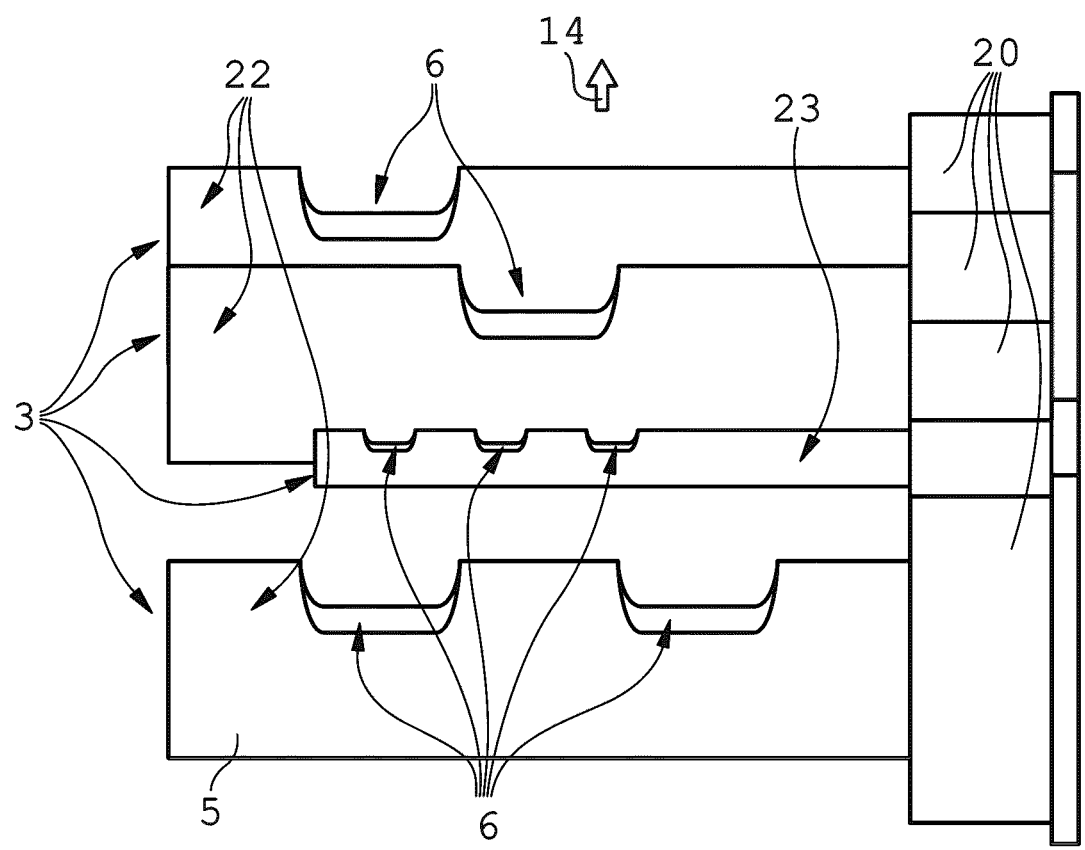

Merely as an example, FIG. 5 shows an in turn deviating arrangement of coaxial conductors 3, which can be advantageously used in particular for the treatment of inhomogeneous products 2. The arrangement includes coaxial conductors 3 of two different types 22, 23. The individual coaxial conductors 3 comprise a different number of openings 6, which are not uniformly distributed across the maximum width of the product 2 to be treated. In the view selected in FIG. 5, from the viewing direction 19 shown in FIG. 1, the product 2 transported past the coaxial conductors 3 in the transport direction 14 can be radiated with microwaves significantly more intensely on the left side of the product 2, and an inhomogeneous product 2, which is significantly harder to heat by microwaves on the left side, can nevertheless be heated to a uniform temperature across the entire product 2 after the treatment process, respectively after its transport past the coaxial conductors 3.

The invention claimed is:

1. A device for treating a product with microwaves, wherein the device comprises a treatment chamber, in which the product can be transported along a transport path in a transport direction through the treatment chamber, and a microwave radiation device arranged in the treatment chamber, by means of which microwaves coupled into the microwave radiation device can be radiated, which act on the product, wherein the microwave radiation device comprises at least one coaxial conductor which protrudes into the treatment chamber, or is arranged therein, with an electrically-conductive internal conductor and an electrically-conductive external conductor, wherein the external conductor, arranged coaxially, surrounds the internal conductor in a spaced manner and comprises at least one opening, which enables an emission of microwaves from the coaxial conductor through the opening on to the product, wherein the microwave radiation device comprises multiple coaxial conductors, which are arranged spaced from one another in the transport direction, with in each case at least one opening in the respective external conductor, wherein in a coaxial conductor arranged successively in the transport direction, the at least one opening is arranged offset, transversally to the transport direction, to the at least one opening of a preceding coaxial conductor, and wherein individual ones of the coaxial conductors can be adapted to an overall desired or predetermined microwave output in terms of the microwave output radiated by each one of the coaxial conductors.

2. The device according to claim 1, wherein the microwave radiation device comprises a predetermined number of coaxial conductors with in each case at least one opening, so that the openings arranged successively in the transport direction completely cover a product, which is transported via the transport path, in a transverse direction extending transversally to the transport direction, across a treatment length of the transport path.

3. The device according to claim 1, wherein each coaxial conductor comprises at least two openings.

4. The device according to claim 1, wherein at least one coaxial conductor is arranged on a first side of the transport path and at least one further coaxial conductor is arranged on a second side of the transport path opposite the first side.

5. The device according to claim 1, wherein at least one coaxial conductor is adapted, with first dimensions, to a first microwave frequency, and at least one further coaxial conductor, with second dimensions different from the first dimensions, is adapted to a second microwave frequency different from the first microwave frequency.

\* \* \* \* \*